US008717072B2

(12) United States Patent
Park (10) Patent No.: US 8,717,072 B2
(45) Date of Patent: May 6, 2014

(54) SEMICONDUCTOR DEVICE AND METHOD FOR DRIVING THE SAME

(75) Inventor: Jung-Hoon Park, Gyeonggi-do (KR)

(73) Assignee: Hynix Semiconductor Inc., Gyoeonggi-do (KR)

(*) Notice: Subject to any disclaimer, the term of this patent is extended or adjusted under 35 U.S.C. 154(b) by 0 days.

(21) Appl. No.: 13/411,907

(22) Filed: Mar. 5, 2012

(65) Prior Publication Data

US 2013/0127503 A1 May 23, 2013

(30) Foreign Application Priority Data

Nov. 18, 2011 (KR) .................. 10-2011-0120594

(51) Int. Cl.
*H03L 7/00* (2006.01)

(52) U.S. Cl.
USPC ........... 327/144; 327/141; 327/142; 327/145; 327/198

(58) Field of Classification Search
USPC .......................................... 327/142, 143, 198
See application file for complete search history.

(56) References Cited

U.S. PATENT DOCUMENTS

| 7,474,136 | B2* | 1/2009 | Heightley ..................... 327/175 |
| 7,532,050 | B2* | 5/2009 | Haerle et al. .................. 327/158 |
| 2007/0120587 | A1* | 5/2007 | Haerle et al. .................. 327/158 |
| 2010/0060333 | A1* | 3/2010 | Manku et al. ................. 327/157 |
| 2012/0019295 | A1* | 1/2012 | Lin .............................. 327/157 |
| 2012/0049911 | A1* | 3/2012 | Ura .............................. 327/156 |

* cited by examiner

*Primary Examiner* — Brandon S Cole
(74) *Attorney, Agent, or Firm* — IP & T Group LLP (57) ABSTRACT

A semiconductor device includes a comparison unit configured to compare the phases of a plurality of clocks having different frequencies and output a phase comparison signal, a phase inversion control unit configured to generate a phase inversion control signal, and a start control unit configured to generate a start control signal in response to a clock enable signal, wherein the comparison unit is configured to start an operation in response to the start control signal and invert, in response to the phase inversion control signal, a phase of an internal clock generated from one of the plurality of clocks when the plurality of clocks have different phases.

13 Claims, 8 Drawing Sheets

SEMICONDUCTOR DEVICE AND METHOD FOR DRIVING THE SAME

CROSS-REFERENCE TO RELATED APPLICATIONS

The present application claims priority of Korean Patent Application No. 10-2011-0120594, filed on Nov. 18, 2011, which is incorporated herein by reference in its entirety.

BACKGROUND

1. Field

Exemplary embodiments of the present invention relate to semiconductor design technology, and more particularly, to a circuit capable of quickly synchronizing a plurality of clocks having different frequencies, where the clocks are used in a semiconductor memory device operating at high speed.

2. Description of the Related Art

In a system including a plurality of semiconductor memory devices, the semiconductor memory devices store data. When a data processing device, for example, a memory control unit (MCU) or the like requests data, a semiconductor memory device outputs data corresponding to an address inputted from the data requesting device or stores data provided from the data requesting device in a position corresponding to the address.

For such an operation, semiconductor memory devices operating at high speed, which have been recently developed, are designed in such a manner as to input/output two bits of data between rising and falling edges of a system clock applied from outside and input/output two bits of data between the falling edge and the next rising edge. Thus, the semiconductor memory devices are designed in such a manner as to input/output four bits of data during one cycle of the system clock.

However, since the system clock is represented, for example, only by two states, i.e., a logic high level and a logic low level, a data clock having a frequency two times higher than the system clock is used to input/output four bits of data during one cycle. That is, a data clock dedicated to data input/output is used.

Therefore, a semiconductor memory device operating at high speed controls the data clock to have a frequency two times higher than the system clock, using the system clock as a reference clock when transmitting/receiving an address and a command and using the data clock as the reference clock when inputting/outputting data.

That is, the semiconductor memory device controls two cycles of the data clock to be repeated during one cycle of the system clock, and controls data input/output to occur at rising and falling edges of the data clock such that four bits of data may be inputted/outputted during one cycle of the system clock.

Unlike a conventional DDR synchronous memory device using one system clock as a reference clock to perform a read or write operation, the semiconductor memory device operating at high speed transmits and receives data using two clocks having different frequencies, in order to perform a read or write operation.

However, when the phases of the system clock and the data clock are not aligned with each other, the phase of the reference clock for transmitting an operation command and an address is not aligned with the phase of the reference clock for transmitting data. In this case, the semiconductor memory device operating at high speed may not operate normally.

Therefore, to normally operate the semiconductor memory device operating at high speed, interface training is to be performed between the semiconductor memory device and the data processing device at the initial stage of the operation.

Here, the interface training indicates that an interface for transmitting a command, an address, and data is trained so as to operate with an optimized timing, before a normal operation between the semiconductor memory device and the data processing device is performed.

The interface training may be divided into address training, clock alignment training (WCK2CK training), read training, write training and so on. Among them, an operation of aligning a data clock and a system clock is performed during the clock alignment training (WCK2CK training).

Meanwhile, when the semiconductor memory device is in a self refresh mode, a system clock and a data clock are not applied from outside, and a system clock buffer and a data clock buffer are disabled and initialized to save electricity. In this case, clock alignment training information disappears. Therefore, in accordance with the conventional semiconductor memory device, when exiting from the self refresh mode, the semiconductor memory device performs a clock alignment training mode or automatic synchronization mode and compares the phases of the system clock and the data clock to perform a normal operation. At this time, the clock alignment training mode or the automatic synchronization mode is performed by a command signal from outside. For example, the command signal from outside may be applied at a predetermined time after the semiconductor memory device exits from the self refresh mode. Therefore, during the clock alignment training mode, a normal operation is not performed and affects the performance of the semiconductor memory device.

SUMMARY

An embodiment of the present invention is directed to a semiconductor device capable of quickly transferring to a normal operation mode from a preparation mode and a method for operating the same.

Another embodiment of the present invention is directed to a semiconductor device capable of synchronizing a plurality of clocks having different frequencies without using an external command signal and a method for operating the same.

In accordance with an embodiment of the present invention, a semiconductor device includes: a comparison unit configured to compare the phases of a plurality of clocks having different frequencies and output a phase comparison signal; a phase inversion control unit configured to generate a phase inversion control signal; and a start control unit configured to generate a start control signal in response to a clock enable signal, wherein the comparison unit is configured to start an operation in response to the start control signal and invert, in response to the phase inversion control signal, a phase of an internal clock generated from one of the plurality of clocks when the plurality of clocks have different phases.

In accordance with another embodiment of the present invention, a semiconductor device includes: a phase comparison unit configured to compare phases of a plurality of clocks having different frequencies; a phase inversion control unit configured to generate a phase inversion control signal; a start control unit configured to generate a start control signal in response to a clock enable signal; a comparison end unit configured to sequentially output, in synchronization with an internal system clock generated from the phase comparison unit, a plurality of signals to generate a comparison end signal as an output of the comparison end unit, wherein the phase comparison unit is further configured to invert, in response to the phase inversion control signal, an internal clock generated from one of the plurality of clocks when the plurality of clocks have different phases.

In accordance with yet another embodiment of the present invention, a method for operating a semiconductor device includes: outputting a phase comparison signal by comparing the phases of a plurality of clocks and having different frequencies; generating a phase inversion control signal for inverting the phase of a data clock when the internal clocks have different phases; and generating a start control signal for starting the outputting of the phase comparison signal in response to a clock enable signal.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
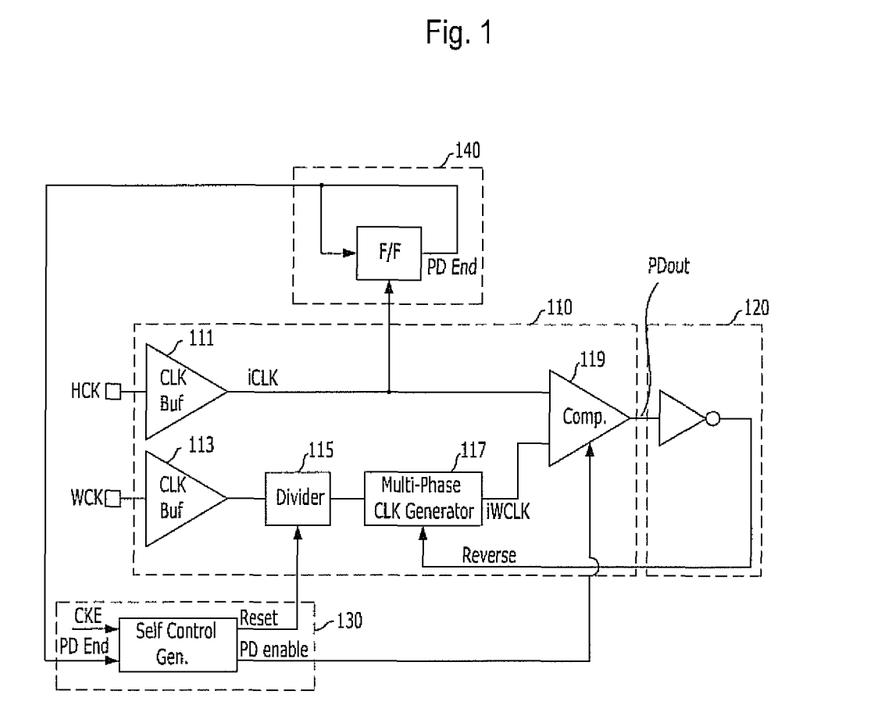
FIG. 1 is a block diagram for clock synchronization in accordance with a first embodiment of the present invention.

FIG. 1 is a block diagram for clock synchronization in accordance with a first embodiment of the present invention.

The block diagram for clock synchronization in accordance with the first embodiment of the present invention includes a comparison unit 110, a phase inversion control unit 120, and a start control unit 130. The comparison unit 110 is configured to compare the phases of a plurality of clocks having different frequencies and output a phase comparison signal PDout. The phase inversion control unit 120 is configured to generate a phase inversion control signal for inverting a phase of an internal clock within the comparison unit 110 when the plurality of clocks have different phases. The start control unit 130 is configured to generate a start control signal for starting the comparison unit 110 using a clock enable signal applied from outside.

The comparison unit 110 in accordance with the first embodiment of the present invention includes a clock reception section 111 and 113, a clock division section 115 and 117, and a comparison section 119. The clock reception section 111 and 113 is configured to receive a system clock HCK and a data clock WCK from an external controller. The clock division section 115 and 117 is configured to generate a data division clock iWCLK by dividing the data clock WCK such that the data division clock iWCLK has the same frequency as the system clock HCK, where a phase of the data division clock iWCLK has been inverted according to a phase inversion signal Reverse and is the same before the inversion as the phase of the received data clock WCK. The comparison section 119 is configured to compare the phase of an internal system clock iCLK outputted from the clock reception section 111 with the selected phase of the data division clock iWCLK, and output the phase comparison signal PDout.

The clock reception section 111 and 113 includes a clock buffer 111 configured to receive the system clock HCK and buffer and output the received system clock HCK, and a clock buffer 113 configured to receive the data clock WCK and buffer and output the received data clock WCK.

The clock division section 115 and 117 includes a divider 115 configured to divide the frequency of the data clock WCK such that the data clock WCK after the division has the same frequency as the system clock HCK and has the same phase as the phase of the received data clock WCK, and a multi-phase clock generator 117 configured to output a plurality of data division clocks iWCLK having different phases using an output of the divider 115.

The comparison section 119 compares one of different phases of data division clock iWCLK with the internal clock iCLK and outputs an "H" level signal when the phases of the signals are identical or an "L" level signal when the phases of the signals are different. Here, the phase of data division clock iWCLK can be any one phase of the data division clock iWCLK.

Here, the system clock HCK is used for synchronizing input timing points of an address signal and a command signal, and the data clock WCK is used for synchronizing input timing points of data signals. Furthermore, the data clock WCK has a higher frequency than the system clock HCK.

The phase inversion control unit 120 in accordance with the first embodiment of the present invention may include a number of inverters and is configured to output a phase inversion signal Reverse obtained by inverting the output of the comparison section 119.

The semiconductor device in accordance with the first embodiment of the present invention may further include a comparison end unit 140 including a flip-flop F/F configured to output a signal in response to a comparison end signal PDEnd, as an output of the comparison end unit 140 and in synchronization with the internal system clock iCLK.

Figure 2:
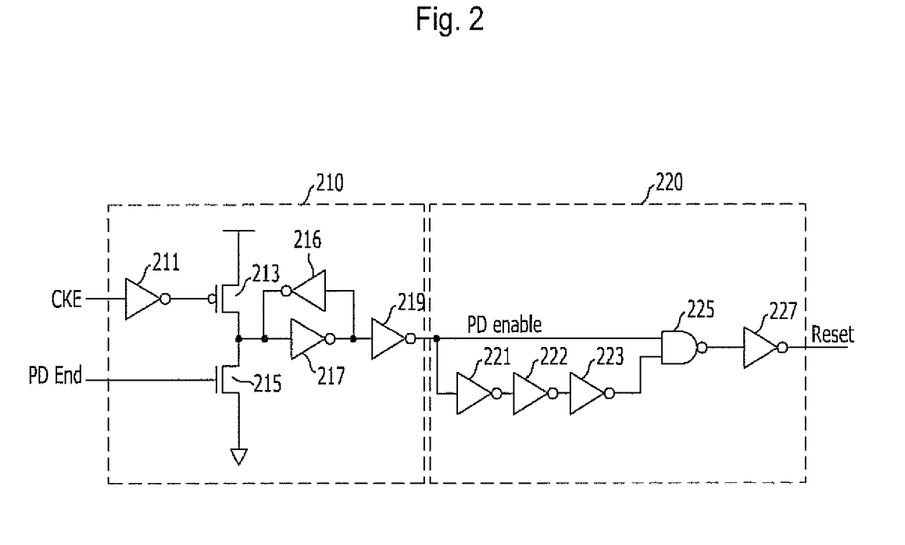
FIG. 2 is a circuit diagram of a start control unit in accordance with the first embodiment of the present invention.

FIG. 2 is a circuit diagram of the start control unit 130 in accordance with the first embodiment of the present invention.

The start control unit 130 in accordance with the first embodiment of the present invention includes a phase detection enable signal output section 210 and a reset signal output section 220. The phase detection enable signal output section 210 is configured to output a phase detection enable signal PDenable at a first level (for example, "H" signal) when a clock enable signal CKE is inputted, and output a phase detection enable signal PDenable at a second level (for example, "L" signal) when the comparison end signal PDEnd is inputted. The reset signal output section 220 is configured to output a reset signal Reset having a desired width using the phase detection enable signal PDenable.

The phase detection enable signal output section 210 in accordance with the first embodiment of the present invention includes an inverter 211, a pair of PMOS and NMOS transistors 213 and 215, and buffers 216, 217, and 219. The inverter 211 is configured to invert the clock enable signal CKE and output an inverted clock enable signal CKEB. The PMOS and NMOS transistors 213 and 215 are configured to be controlled by the inverted clock enable signal CKEB or the comparison end signal PDEnd and output a power supply voltage or ground voltage. The buffers 216, 217, and 219 are configured to output the power supply voltage or ground voltage as the phase detection enable signal PDenable after a desired first delay time.

The reset signal output section 220 in accordance with the first embodiment of the present invention is configured to output a reset signal Reset having a desired width, using the phase detection enable signal PDenable. Here, the desired width of the reset signal Reset differs depending on the number of inverters 221, 222, and 223, and the number of inverters may be set to a number equal to or more than two.

Figure 3:
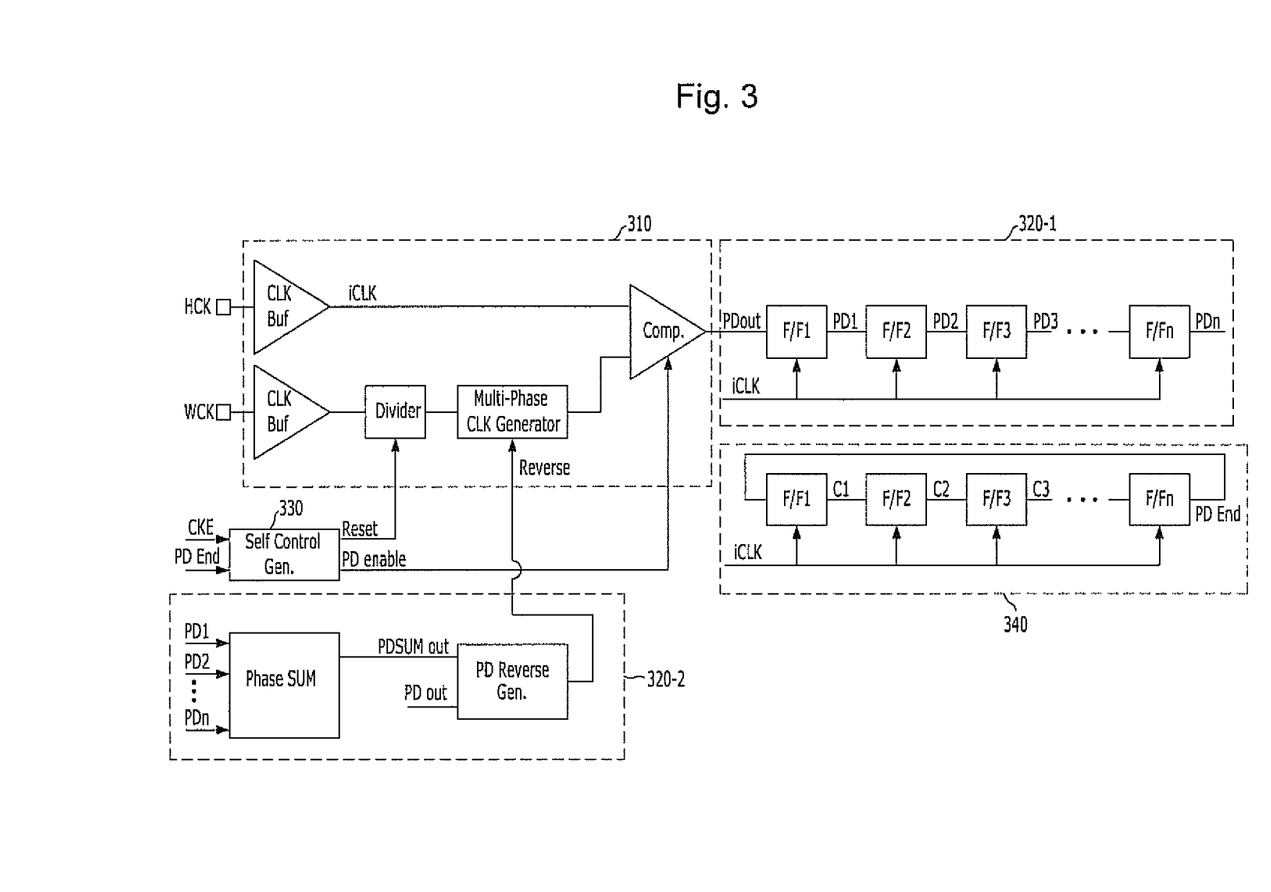
FIG. 3 is a block diagram for clock synchronization in accordance with a second embodiment of the present invention.
Figure 4:
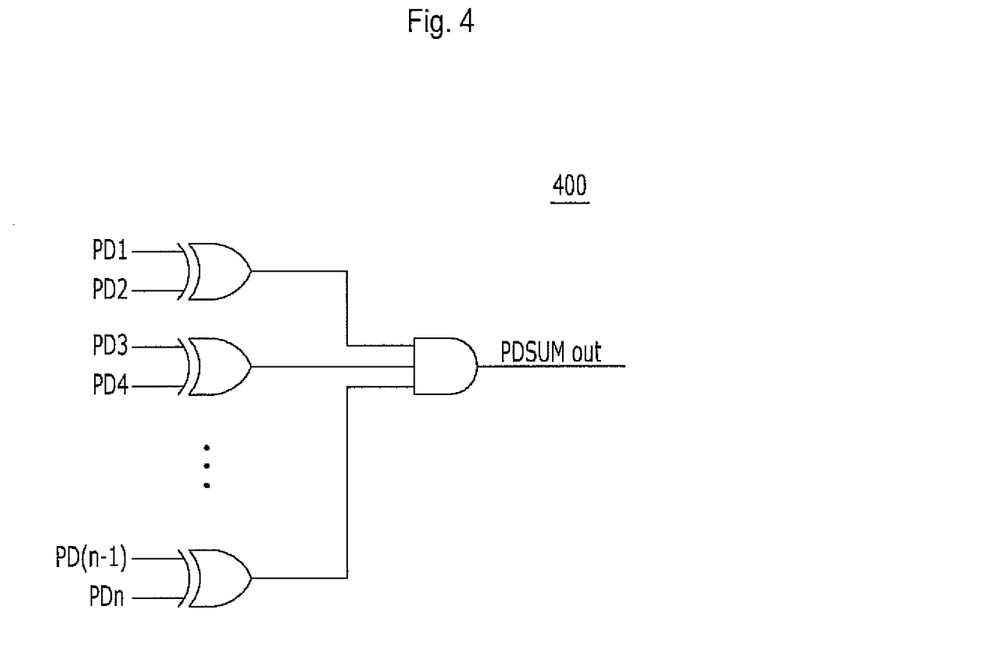
FIG. 4 is a circuit diagram of a phase detection synthesizer in accordance with the second embodiment of the present invention.
Figure 5:
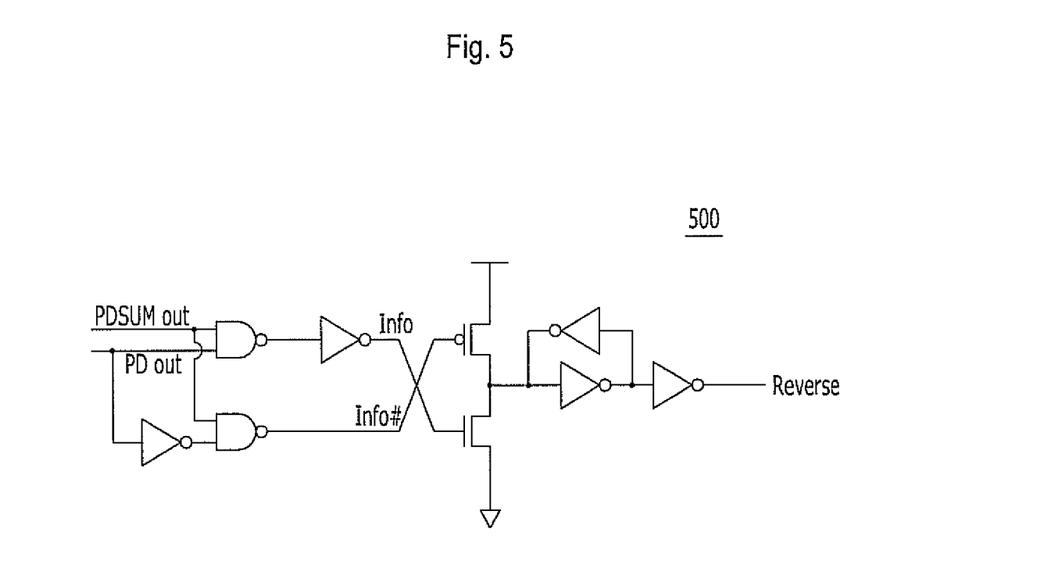
FIG. 5 is a circuit diagram of a phase inversion control signal generator in accordance with the second embodiment of the present invention.

FIG. 3 is a block diagram for clock synchronization in accordance with a second embodiment of the present invention. FIG. 4 is a circuit diagram of a phase detection synthesizer in accordance with the second embodiment of the present invention. FIG. 5 is a circuit diagram of a phase inversion control signal generator in accordance with the second embodiment of the present invention.

The block diagram for clock synchronization in accordance with the second embodiment of the present invention includes a comparison unit 310, a phase inversion control unit 320-1 and 320-2, a start control unit 330, and a comparison end unit 340. The comparison unit 310 is configured to compare the phases of a plurality of clocks having different frequencies. The phase inversion control unit 320-1 and 320-2 is configured to generate a phase inversion control signal for inverting any one of the plurality of clocks within the comparison unit 310, when the plurality of clocks have different phases. The start control unit 330 is configured to generate a start control signal for starting the comparison unit 310 using a clock enable signal applied from outside. The comparison end unit 340 includes a plurality of flip-flops F/F coupled in series and configured to output a signal in response to a comparison end signal PDEnd which is an output of the comparison end unit 340, in synchronization with an internal system clock iCLK.

The phase inversion control unit 320-1 and 320-2 in accordance with the second embodiment of the present invention includes a phase detection maintenance section 320-1, a phase detection synthesizer Phase SUM, and a phase inversion control signal generator PD Reverse Gen. The phase detection maintenance section 320-1 is configured to sequentially output a plurality of signals PD1, PD2, ..., PDn in response to a phase comparison signal PDout outputted from the comparison unit, in synchronization with an internal system clock iCLK. The phase detection synthesizer Phase SUM is configured to output a phase detection synthesis signal PDSUMout at a first level (for example, "H" level) when the inputted signals PD1, PD2, ..., PDn have the same phase. The phase inversion control signal generator PD Reverse Gen. is configured to generate a phase inversion control signal using the phase detection synthesis signal PDSUMout and the phase comparison signal PDout.

The phase detection maintenance section 320-1 in accordance with the second embodiment of the present invention includes first to n-th flip-flops F/F1, F/F2, ..., F/Fn coupled in series. The first to n-th flip-flops F/F1, F/F2, ..., F/Fn are configured to sequentially output the phase comparison signal PDout in synchronization with the internal system clock iCLK.

The phase detection synthesizer Phase SUM in accordance with the second embodiment of the present invention is configured to receive outputs PD1, PD2, ..., PDn of the first to n-th flip-flops F/F1, F/F2, ..., F/Fn within the phase detection maintenance section 320-1 and output the phase detection synthesis signal PDSUMout at the first level (for example, "H" signal) when all of the outputs have the same phase.

The phase inversion control signal generator PD Reverse Gen. in accordance with the second embodiment of the present invention is configured to output a phase inversion control signal Reverse at the first level (for example, "H" level) when the phase detection synthesis signal PDSUMout and the phase comparison signal PDout have different phases, and output a phase inversion control signal Reverse at the second level (for example, "L" level) when the phase detection synthesis signal PDSUMout and the phase comparison signal PDout have the same phase.

The comparison end unit 340 in accordance with the second embodiment of the present invention may include one or more flip-flops, and the number of the flip-flops may be set to equal the number of the flip-flops within the phase inversion control unit 320.

Figure 6:
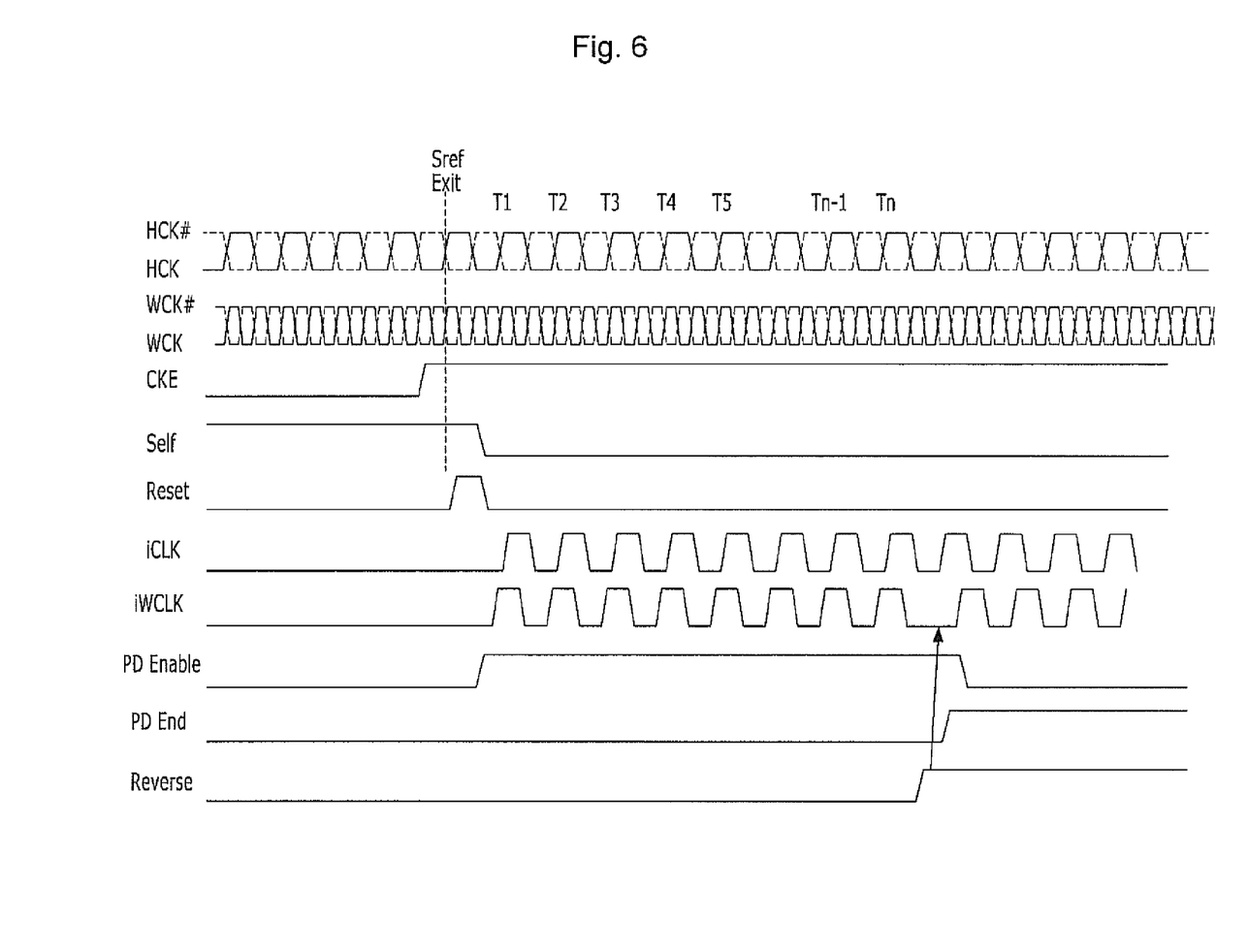
FIG. 6 is a timing diagram of a phase inversion control signal generator during phase inversion in accordance with the second embodiment of the present invention.
Figure 7:
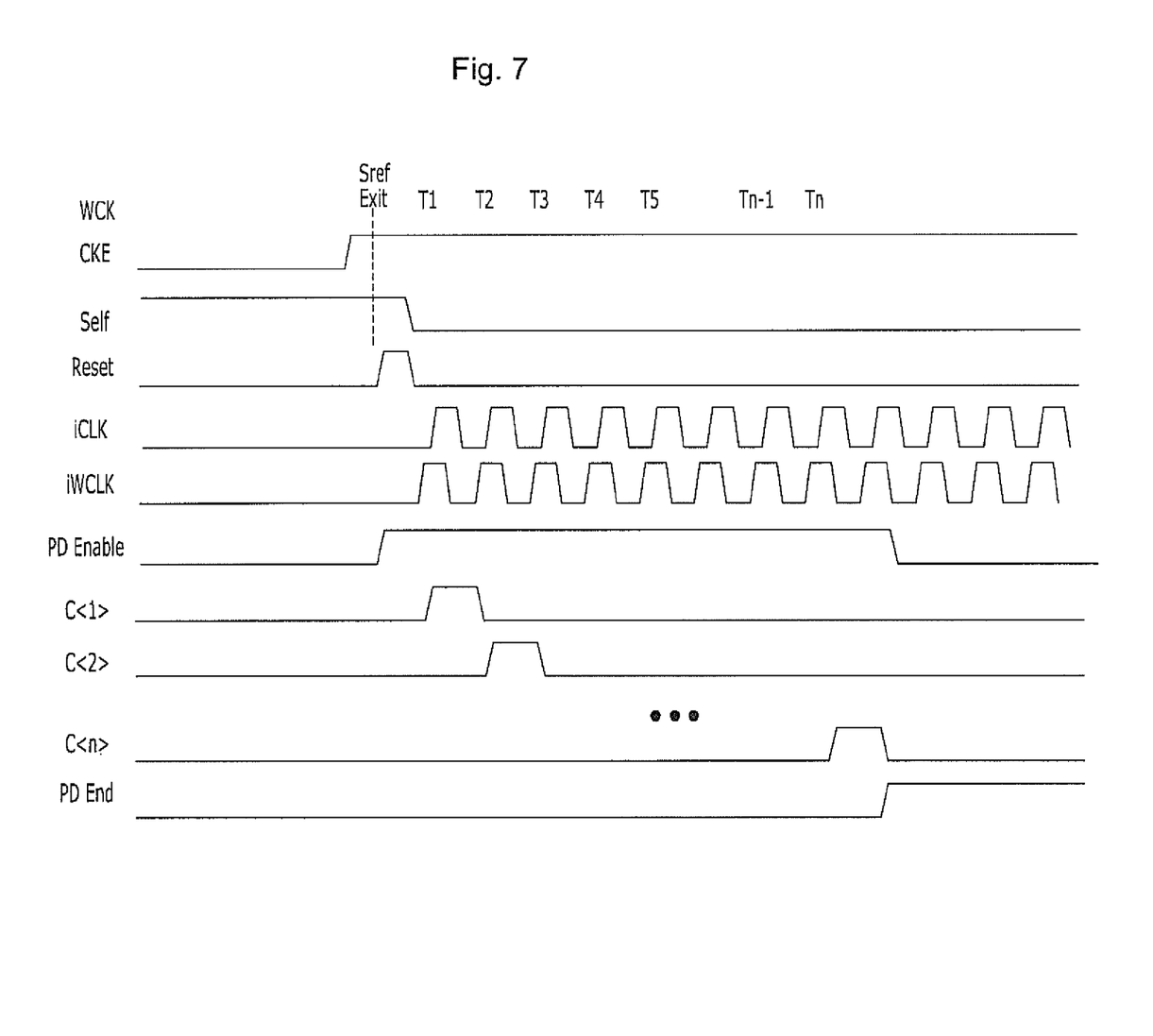
FIG. 7 is a timing diagram of a self control signal generator in accordance with the second embodiment of the present invention.
Figure 8:
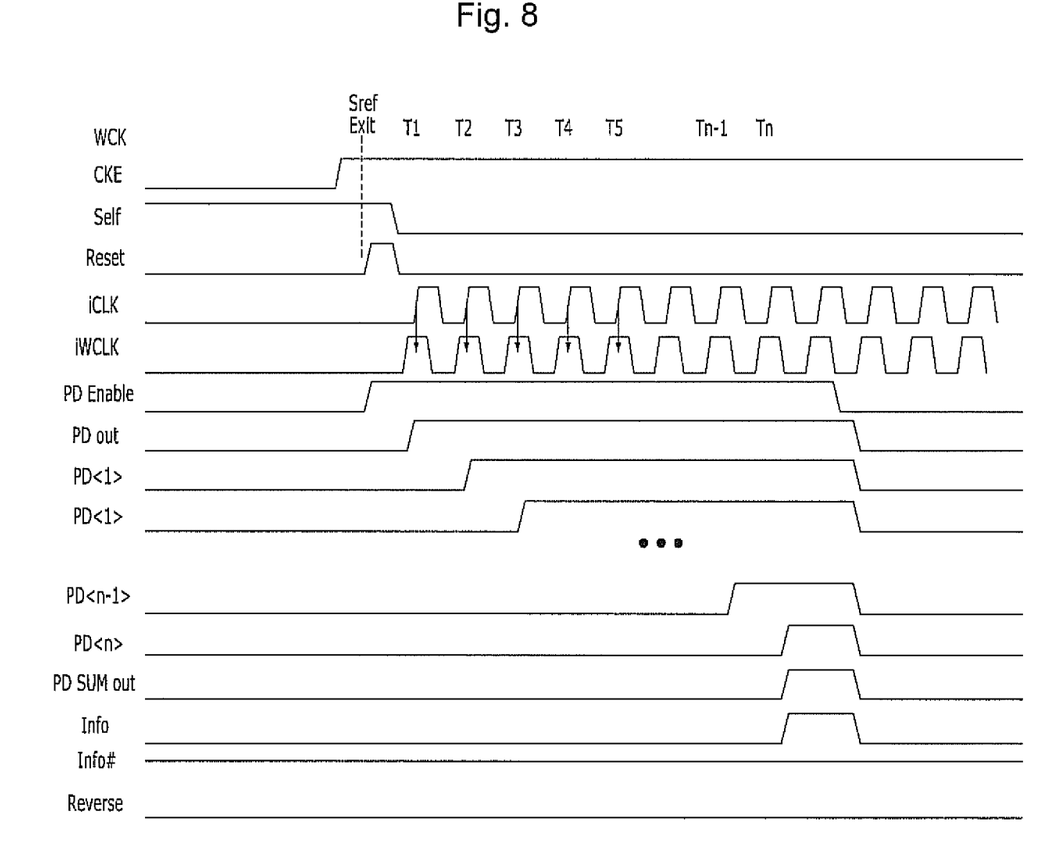
FIG. 8 is a timing diagram during a clock synchronization mode in accordance with the second embodiment of the present invention.
Figure 9:
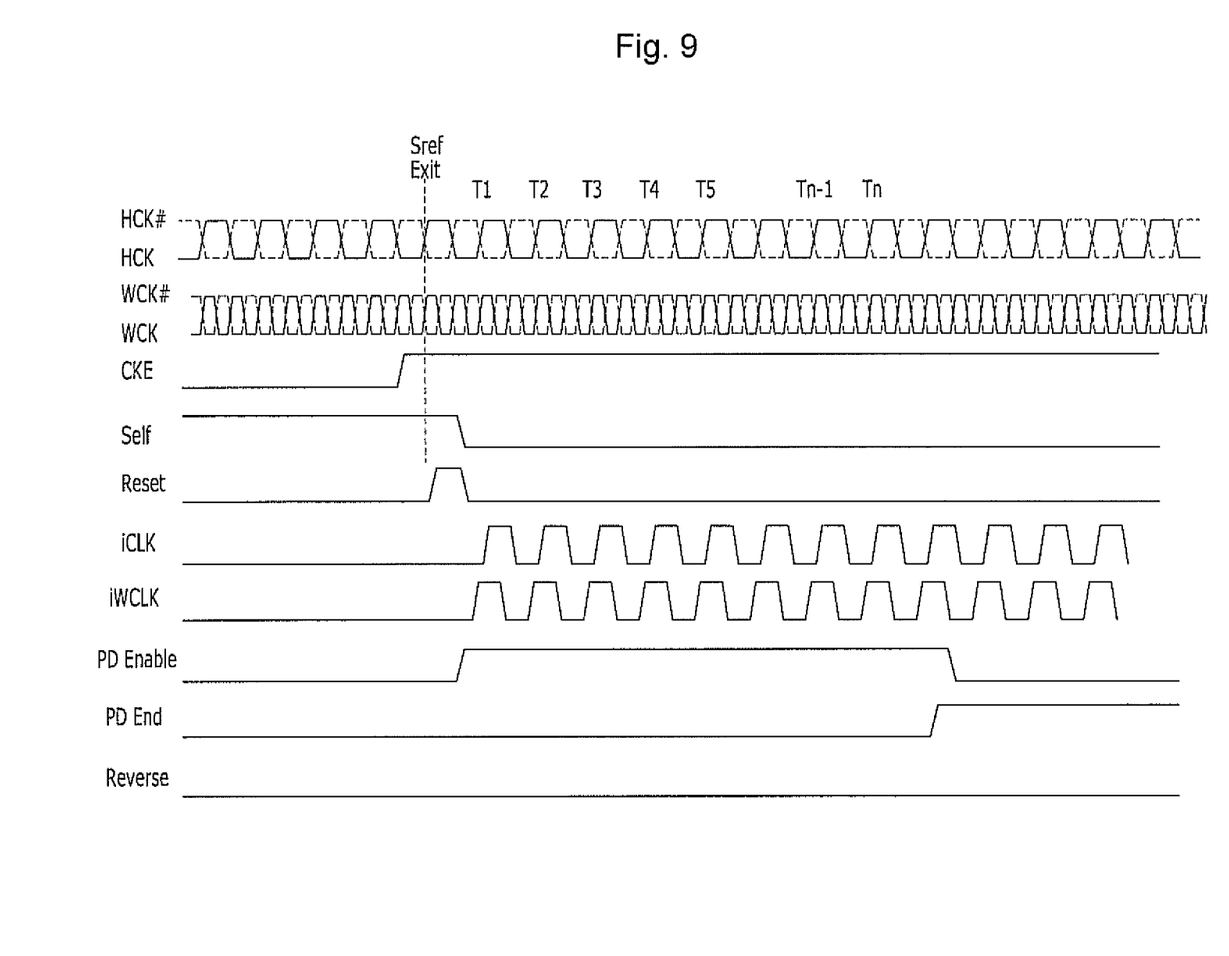
FIG. 9 is a timing diagram of the phase inversion control signal generator during phase non-inversion in accordance with the second embodiment of the present invention.

FIG. 6 is a timing diagram of the phase inversion control signal generator PD Reverse Gen. during phase inversion in accordance with the second embodiment of the present invention. FIG. 7 is a timing diagram of the self control signal generator 330 in accordance with the second embodiment of the present invention. FIG. 8 is a timing diagram during the clock synchronization mode in accordance with the second embodiment of the present invention. FIG. 9 is a timing diagram of the phase inversion control signal generator PD Reverse Gen. during phase non-inversion in accordance with the second embodiment of the present invention.

The phase detection enable signal output section 210 generates the phase detection enable signal PDenable and the reset signal output section 220 generates the reset signal Reset, using the clock enable signal CKE applied from outside. The divider 115 is controlled by the reset signal Reset and divides the frequency of the data clock WCK, where the divided data clock WCK has the same phase as the phase of the received data clock WCK, and the comparison section 119 is enabled by the phase detection enable signal PDenable and compares the phases of the data division clock iWCK and the internal system clock iCLK.

Referring to FIG. 6, when the two phases are different, the comparison section 119 outputs a phase comparison signal PDout at an "L" level, and the first to n-th flip-flops F/F1, F/F2, ..., F/Fn within the phase detection maintenance section 320-1 sequentially output the phase comparison signal PDout in synchronization with the internal system clock iCLK.

The phase detection synthesizer Phase SUM outputs a phase detection synthesis signal PDSUMout at an "H" level when all of the outputs PD1, PD2, ..., PDn of the first to n-th flip-flops F/F1, F/F2, ..., F/Fn within the phase detection maintenance section 320-1 have the same level.

Referring to FIGS. 6 and 9, the phase detection control signal generator PD Reverse Gen. outputs a phase inversion control signal Reverse at the first level (for example, "H" level) when the phase detection synthesis signal PDSUMout and the phase comparison signal PDout have different phases and outputs a phase inversion control signal Reverse at the second level (for example, "L" level) when the phase detection synthesis signal PDSUMout and the phase comparison signal PDout have the same phase.

Referring to FIG. 7, the phase detection enable signal PDenable is disabled when the comparison end unit 340 outputs the comparison end signal PDEnd.

Meanwhile, according to exemplary embodiments of the present invention, a plurality of clocks having different frequencies may be synchronized using a clock enable signal without using an external command signal and may be utilized in a self-refresh mode, an auto-refresh mode, an active power down mode, a precharge mode or the like, for example, in a case in which the semiconductor memory device exits from a low-power state.

Furthermore, the semiconductor memory device in accordance with the embodiments of the present invention may be applied to a semiconductor device which is driven at high speed using different frequencies, such as a micro controller unit (MCU).

In accordance with the embodiments of the present invention, the semiconductor device may quickly transfer to a normal operation mode from a preparation mode and may synchronize a plurality of clocks having different frequencies without using an external command signal.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a comparison unit configured to compare the phases of a plurality of clocks having different frequencies and output a phase comparison signal;
a phase inversion control unit configured to generate a phase inversion control signal; and
a start control unit configured to generate a start control signal in response to a clock enable signal,
wherein the comparison unit is configured to start an operation in response to the start control signal and invert, in response to the phase inversion control signal, a phase of an internal clock generated from one of the plurality of clocks when the plurality of clocks have different phases,
wherein the comparison unit comprises:
a clock reception section configured to receive a system clock and a data clock;
a clock division section configured to generate a data division clock by dividing the data clock such that the data division clock has the same frequency as the system clock and generate a phase of the data division clock by inverting the data division clock according to the phase inversion control signal; and
a comparison section configured to compare a phase of an internal system clock outputted from the clock reception unit with the phase of the data division clock and output the phase comparison signal.

2. The semiconductor device of claim 1, further comprising a comparison end unit configured to output a comparison end signal when the plurality of clocks have the same phase, wherein the start control unit is configured to stop the generation of the start control signal in response to the comparison end signal.

3. The semiconductor device of claim 2, wherein the comparison end unit comprises a flip-flop configured to output, in synchronization with an internal system clock, a signal as a comparison end signal of the comparison end unit.

4. The semiconductor device of claim 1, wherein the clock reception section comprises:
a system clock buffer configured to receive and buffer the system clock and output the received system clock; and
a data clock buffer configured to receive and buffer the data clock and output the received data clock.

5. The semiconductor device of claim 1, wherein the clock division section comprises:
a divider configured to divide the data clock such that the data division clock has the same frequency as the system clock; and
a multi-phase clock generator configured to output the phase of the data division clock using an output of the divider.

6. The semiconductor device of claim 1, wherein the phase inversion control unit comprises at least one inverter.

7. The semiconductor device of claim 1, wherein the start control unit comprises:
a phase detection enable signal output section configured to output a phase detection enable signal at a first level when a clock enable signal is inputted and output a phase detection enable signal at a second level when a comparison end signal is inputted; and
a reset signal output section configured to output a reset signal having a pulse width using the phase detection enable signal.

8. The semiconductor device of claim 1, wherein the semiconductor device comprises a nonvolatile memory device or a micro controller unit.

9. The semiconductor device of claim 1, wherein the comparison unit includes a divider configured to divide one of the plurality of clocks and is reset in response to a reset signal output from the start control unit.

10. The semiconductor device of claim 9, wherein the comparison unit includes a first buffer configured to receive a first one of the plurality of clocks and a second buffer configured to receive a second one of the plurality of clocks that has a higher frequency than the first clock, and the divider is configured to receive the second clock from the second buffer.

11. A semiconductor device comprising:
a phase comparison unit configured to compare phases of a plurality of clocks having different frequencies;
a phase inversion control unit configured to generate a phase inversion control signal;
a start control unit configured to generate a start control signal in response to a clock enable signal; and
a comparison end unit configured to sequentially output, in synchronization with an internal system clock generated from the phase comparison unit, a plurality of signals to generate a comparison end signal as an output of the comparison end unit,
wherein the phase comparison unit is configured to invert, in response to the phase inversion control signal, an internal clock generated from one of the plurality of clocks when the plurality of clocks have different phases,
wherein the phase inversion control unit comprises:
a phase detection maintenance section configured to sequentially output, in synchronization with the internal system clock, a plurality of signals in response to a phase comparison signal outputted from the phase comparison unit;

a phase detection synthesizer configured to output a phase detection synthesis signal when the plurality of signals outputted from the phase detection maintenance section have the same phase; and a phase inversion control signal generator configured to generate the phase inversion control signal when the phases of the phase detection synthesis signal and the phase comparison signal are different from each other.

12. The semiconductor device of claim 11, wherein the phase detection maintenance section comprises first to n-th flip-flops coupled in series, and the first to n-th flip-flops are configured to sequentially output the phase comparison signal in synchronization with the internal system clock.

13. The semiconductor device of claim 11, wherein the comparison end unit comprises one or more flip-flops, and the number of the flip-flops is equal to the number of flip-flops within the phase inversion control unit.

* * * * *

UNITED STATES PATENT AND TRADEMARK OFFICE
CERTIFICATE OF CORRECTION

PATENT NO. : 8,717,072 B2  Page 1 of 1
APPLICATION NO. : 13/411907
DATED : May 6, 2014
INVENTOR(S) : Jung-Hoon Park It is certified that error appears in the above-identified patent and that said Letters Patent is hereby corrected as shown below:

On the title page item (73) should read:

(73)   Assignee:   Hynix Semiconductor Inc.,
                   Gyeonggi-do (KR)

Signed and Sealed this
Eighth Day of July, 2014

Michelle K. Lee
*Deputy Director of the United States Patent and Trademark Office*